United States Patent
Sullam et al.

(10) Patent No.: US 10,826,499 B2
(45) Date of Patent: *Nov. 3, 2020

(54) SYSTEM LEVEL INTERCONNECT WITH PROGRAMMABLE SWITCHING

(71) Applicant: Cypress Semiconductor Corporation, San Jose, CA (US)

(72) Inventors: Bert Sullam, Bellevue, WA (US); Warren Snyder, Lake Stevens, WA (US); Haneef Mohammed, Beaverton, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/688,764

(22) Filed: Nov. 19, 2019

(65) Prior Publication Data

US 2020/0169259 A1    May 28, 2020

Related U.S. Application Data

(63) Continuation of application No. 16/146,446, filed on Sep. 28, 2018, now Pat. No. 10,516,397, which is a
(Continued)

(51) Int. Cl.
| | |
|---|---|
| *H03K 19/17* | (2006.01) |
| *H01L 25/00* | (2006.01) |
| *H03K 19/17736* | (2020.01) |
| *H03K 19/177* | (2020.01) |
| *H03K 19/17704* | (2020.01) |

(Continued)

(52) U.S. Cl.
CPC ..... *H03K 19/17744* (2013.01); *H03K 19/173* (2013.01); *H03K 19/177* (2013.01); *H03K 19/1776* (2013.01); *H03K 19/17704* (2013.01)

(58) Field of Classification Search
None
See application file for complete search history.

(56) References Cited

U.S. PATENT DOCUMENTS

| | | |
|---|---|---|
| 3,805,245 A | 4/1974 | Brooks et al. |
| 4,454,589 A | 6/1984 | Miller |

(Continued)

OTHER PUBLICATIONS

A.F. Harvey, "DMA Fundamentals on Various PC Platforms," 2001, 2004, National Instruments Corporation, pp. 1-19; 19 pages.

(Continued)

*Primary Examiner* — Anh Q Tran

(57) ABSTRACT

A method for operating a system level interconnect in an integrated circuit (IC) is provided in an example embodiment. The method comprises: writing, by a microcontroller in the IC, a first configuration value into a configuration register, where the first configuration value programs the system level interconnect to couple a first peripheral to a second peripheral; monitoring the IC to determine an operational state of the IC; and in response to determining a change in the operational state of the IC, writing by the microcontroller a second configuration value into the configuration register to dynamically change interconnections in the system level interconnect between the first peripheral and the second peripheral.

5 Claims, 17 Drawing Sheets

Related U.S. Application Data continuation of application No. 15/848,944, filed on Dec. 20, 2017, now Pat. No. 10,097,185, which is a continuation of application No. 15/277,171, filed on Sep. 27, 2016, now abandoned, which is a continuation of application No. 14/968,247, filed on Dec. 14, 2015, now Pat. No. 9,553,588, which is a continuation of application No. 13/914,308, filed on Jun. 10, 2013, now Pat. No. 9,325,320, which is a continuation of application No. 13/197,624, filed on Aug. 3, 2011, now Pat. No. 8,476,928, which is a continuation of application No. 11/965,677, filed on Dec. 27, 2007, now Pat. No. 8,026,739.

(60) Provisional application No. 60/912,399, filed on Apr. 17, 2007.

(51) Int. Cl.
*H03K 19/173* (2006.01)
*H03K 19/1776* (2020.01)

(56) References Cited

U.S. PATENT DOCUMENTS

| | | | |
|---|---|---|---|
| 4,926,355 A | 5/1990 | Boreland | |
| 5,341,267 A | 8/1994 | Whitten et al. | |
| 5,497,498 A | 3/1996 | Taylor | |
| 5,542,055 A | 7/1996 | Amini et al. | |
| 5,594,876 A | 1/1997 | Getzlaff et al. | |
| 5,617,041 A | 4/1997 | Lee et al. | |
| 5,760,612 A | 6/1998 | Ramirez | |
| 5,790,882 A | 8/1998 | Silver et al. | |
| 6,002,268 A | 12/1999 | Sasaki et al. | |
| 6,003,107 A | 12/1999 | Ranson et al. | |
| 6,006,321 A | 12/1999 | Abbott | |
| 6,006,322 A | 12/1999 | Muramatsu | |
| 6,014,723 A | 1/2000 | Tremblay et al. | |
| 6,018,559 A | 1/2000 | Azegami et al. | |
| 6,055,584 A | 4/2000 | Bridges et al. | |
| 6,121,791 A | 9/2000 | Abbott | |
| 6,130,553 A | 10/2000 | Nakaya | |
| 6,215,326 B1 | 4/2001 | Jefferson et al. | |
| 6,218,859 B1 | 4/2001 | Pedersen | |
| 6,253,250 B1 | 6/2001 | Evans et al. | |
| 6,260,087 B1 | 7/2001 | Chang | |
| 6,404,224 B1 | 6/2002 | Azegami et al. | |
| 6,449,628 B1 | 9/2002 | Wasson | |
| 6,473,825 B1 | 10/2002 | Worley et al. | |
| 6,476,634 B1 | 11/2002 | Bilski | |
| 6,496,971 B1 | 12/2002 | Lesea et al. | |
| 6,614,320 B1 | 9/2003 | Sullam et al. | |
| 6,691,193 B1 | 2/2004 | Wang et al. | |
| 6,745,369 B1 | 6/2004 | May et al. | |
| 6,757,761 B1 | 6/2004 | Smith et al. | |
| 6,774,669 B1 | 8/2004 | Liu et al. | |
| 6,864,710 B1 | 3/2005 | Lacey et al. | |
| 6,960,936 B2 | 11/2005 | Cambonie | |
| 7,043,710 B2 | 5/2006 | Reese et al. | |
| 7,274,212 B1 | 9/2007 | Burney et al. | |
| 7,305,510 B2 | 12/2007 | Miller | |
| 7,373,437 B2 | 5/2008 | Seigneret et al. | |
| 7,389,487 B1 | 6/2008 | Chan et al. | |
| 7,472,155 B2 | 12/2008 | Simkins et al. | |
| 7,737,724 B2 | 6/2010 | Snyder et al. | |
| 7,741,865 B1 | 6/2010 | Sharpe-Geisler et al. | |
| 7,882,165 B2 | 2/2011 | Simkins et al. | |
| 8,024,678 B1 | 9/2011 | Taylor et al. | |
| 8,026,739 B2 | 9/2011 | Sullam et al. | |
| 8,183,881 B1 | 5/2012 | Stassart et al. | |
| 8,476,928 B1 | 7/2013 | Sullam et al. | |
| 8,482,313 B2 | 7/2013 | Snyder et al. | |
| 8,516,025 B2 | 8/2013 | Synder et al. | |
| 8,572,297 B2 | 10/2013 | Swindle et al. | |
| 9,325,320 B1 | 4/2016 | Sullam et al. | |
| 9,553,588 B2 * | 1/2017 | Sullam | H03K 19/177 |
| 10,097,185 B2 | 10/2018 | Sullam et al. | |
| 2001/0006347 A1 | 7/2001 | Jefferson et al. | |
| 2001/0052793 A1 | 12/2001 | Nakaya | |
| 2003/0055852 A1 | 3/2003 | Wojko | |
| 2004/0000928 A1 | 1/2004 | Cheng et al. | |
| 2004/0017222 A1 | 1/2004 | Betz et al. | |
| 2004/0034843 A1 | 2/2004 | Osann | |
| 2005/0066152 A1 | 3/2005 | Garey | |
| 2005/0091472 A1 | 4/2005 | Master et al. | |
| 2005/0134308 A1 | 6/2005 | Okada et al. | |
| 2006/0066345 A1 | 3/2006 | Leijten-Nowak | |
| 2006/0181305 A1 | 8/2006 | Balasubramanian et al. | |
| 2006/0230096 A1 | 10/2006 | Thendean et al. | |
| 2007/0139074 A1 | 6/2007 | Reblewski | |
| 2007/0258458 A1 | 11/2007 | Kapoor | |
| 2008/0042687 A1 | 2/2008 | Mori et al. | |
| 2008/0094102 A1 | 4/2008 | Osann | |
| 2008/0186052 A1 | 8/2008 | Needham et al. | |
| 2008/0258759 A1 | 10/2008 | Snyder et al. | |
| 2008/0263319 A1 | 10/2008 | Snyder et al. | |
| 2008/0263334 A1 | 10/2008 | Synder et al. | |

OTHER PUBLICATIONS

Balough et al., "White Paper: Comparing IP Integration Approaches for FPGA Implementation," Feb. 2007, Version 1.1, Altera, pp. 1-7; 7 pages.

International Search Report for International Application No. PCT/US08/60695 dated Jul. 22, 2009; 3 pages.

John Mangino, "Using DMA with High Performance Peripherals to Maximize System Performance," 2007, Texas Instruments, pp. 1-23; 23 pages.

USPTO Non-Final Rejection for U.S. Appl. No. 11/965,677 dated Mar. 10, 2009; 10 pages.

USPTO Non-Final Rejection for U.S. Appl. No. 13/197,624 dated Aug. 3, 2012; 8 pages.

USPTO Non-Final Rejection for U.S. Appl. No. 13/914,308 dated Feb. 25, 2015; 5 pages.

USPTO Non-Final Rejection for U.S. Appl. No. 15/277,171 dated Apr. 13, 2017; 6 pages.

USPTO Non-Final Rejection for U.S. Appl. No. 16/146,446 dated May 20, 2019; 8 pages.

USPTO Notice of Allowance for U.S. Appl. No. 11/965,677 dated Feb. 12, 2010; 4 pages.

USPTO Notice of Allowance for U.S. Appl. No. 11/965,677 dated Sep. 10, 2009; 6 pages.

USPTO Notice of Allowance for U.S. Appl. No. 11/965,677 dated Nov. 2, 2009; 4 pages.

USPTO Notice of Allowance for U.S. Appl. No. 11/965,677 dated Jan. 6, 2011; 4 pages.

USPTO Notice of Allowance for U.S. Appl. No. 11/965,677 dated May 12, 2011; 5 pages.

USPTO Notice of Allowance for U.S. Appl. No. 11/965,677 dated May 19, 2010; 4 pages.

USPTO Notice of Allowance for U.S. Appl. No. 11/965,677 dated Sep. 15, 2010; 4 pages.

USPTO Notice of Allowance for U.S. Appl. No. 13/197,624 dated Feb. 14, 2013; 5 pages.

USPTO Notice of Allowance for U.S. Appl. No. 13/197,624 dated Apr. 12, 2013; 6 pages.

USPTO Notice of Allowance for U.S. Appl. No. 13/197,624 dated Nov. 30, 2012; 7 pages.

USPTO Notice of Allowance for U.S. Appl. No. 13/914,308 dated May 7, 2015; 8 pages.

USPTO Notice of Allowance for U.S. Appl. No. 13/914,308 dated Sep. 1, 2015; 6 pages.

USPTO Notice of Allowance for U.S. Appl. No. 14/968,247 dated Jun. 8, 2016; 8 pages.

USPTO Notice of Allowance for U.S. Appl. No. 14/968,247 dated Sep. 28, 2016; 5 pages.

USPTO Notice of Allowance for U.S. Appl. No. 15/277,171 dated Sep. 22, 2017; 7 pages.

(56) References Cited

OTHER PUBLICATIONS

USPTO Notice of Allowance for U.S. Appl. No. 15/848,944 dated Jun. 6, 2018, 8 pp.
USPTO Notice of Allowance for U.S. Appl. No. 16/146,446 dated Sep. 27, 2019; 7 pages.
USPTO Notice of Allowance for U.S. Appl. No. 13/914,308 dated Dec. 21, 2015; 6 pages.
Vixel, "InSpeed SOC 320 Embedded Storage Switch," 2003, Vixel, pp. 1-5; 5 pages.
Written Opinion of the International Searching Authority for International Application No. PCT/US08/60695 dated Jul. 22, 2009; 6 pages.

* cited by examiner

SYSTEM LEVEL INTERCONNECT WITH PROGRAMMABLE SWITCHING

RELATED APPLICATIONS

The present application is a continuation application of U.S. patent application Ser. No. 16/146,446, filed on Sep. 28, 2018, which is a continuation of U.S. patent application Ser. No. 15/848,944, filed Dec. 20, 2017, now U.S. Pat. No. 10,097,185, issued Oct. 9, 2018, which is a continuation of U.S. patent application Ser. No. 15/277,171, filed Sep. 27, 2016, which is a continuation of U.S. patent application Ser. No. 14/968,247, filed Dec. 14, 2015, now U.S. Pat. No. 9,553,588, issued Jan. 24, 2017, which is a continuation of U.S. patent application Ser. No. 13/914,308, filed Jun. 10, 2013, now U.S. Pat. No. 9,325,320, issued Apr. 26, 2016, which is a continuation of U.S. patent application Ser. No. 13/197,624, filed Aug. 3, 2011, now U.S. Pat. No. 8,476,928, issued Jul. 2, 2013, which is a continuation of U.S. patent application Ser. No. 11/965,677, filed Dec. 27, 2007, now U.S. Pat. No. 8,026,739, issued Sep. 27, 2011, which claims priority to U.S. Provisional Patent Application No. 60/912,399, filed Apr. 17, 2007, all of which are hereby incorporated by reference herein in their entirety.

TECHNICAL FIELD

The present disclosure relates generally to programmable devices, and more particularly to a programmable interconnect matrix.

BACKGROUND

Field-programmable gate arrays (FPGAs) and programmable logic devices (PLDs) have been used in data communication and telecommunication systems. Conventional PLDs and FPGAs consist of an array of programmable elements, with the elements programmed to implement a fixed function or equation. Some currently available Complex PLD (CPLD) products comprise arrays of logic cells. Conventional PLD devices have several drawbacks, such high power and large silicon area.

In developing complex electronic systems, there is often a need for additional peripheral units, such as operational and instrument amplifiers, filters, timers, digital logic circuits, analog to digital and digital to analog converters, etc. As a general rule, implementation of these extra peripherals create additional difficulties: extra space for new components, additional attention during production of a printed circuit board, and increased power consumption. All of these factors can significantly affect the price and development cycle of the project.

The introduction of Programmable System on Chip (PSoC) chips feature digital and analog programmable blocks, which allow the implementation of a large number of peripherals. A programmable interconnect allows analog and digital blocks to be combined to form a wide variety of functional modules. The digital blocks consist of smaller programmable blocks and are configured to provide different digital functions. The analog blocks are used for development of analog elements, such as analog filters, comparators, inverting amplifiers, as well as analog to digital and digital to analog converters. Current PSoC architectures provide only a coarse grained digital programmability in which a few fixed functions with a small number of options are available.

SUMMARY

Different functional elements are all located on a same intew-ated circuit wherein at least one of the functional elements comprises a micro-controller. Configuration registers or configuration memory in the integrated circuit store configuration values loaded by the micro-controller or some other data transfer mechanism such as Direct Memory Access (DMA). I/O pins are configured to connect the integrated circuit to external signals. A system level interconnect also located in the integrated circuit programmably connects together the different functional elements and different IO pins according to the configuration values loaded into the configuration registers.

The system level interconnect can dynamically change the connections between the different functional elements and the different TO pins in real-time according to different operational states of the integrated circuit. Any of the different functional elements in the integrated circuit can be connected to any of the different I/O pins and any of the different functional elements can be connected to each other according to the configuration values.

A first set of the functional elements can comprise analog peripherals and a second set of the functional elements can comprise digital peripherals. The system level interconnect can be programmed according to the configuration values to couple an IO pin to one of the analog peripherals while the integrated circuit is in a first state and then couple the same I/O pin to one of the digital peripherals when the integrated circuit is in a second different state.

The functional elements can further include multiple digital blocks that each include programmable logic device sections having uncommitted user programmable logic functions and datapath sections having structural arithmetic elements that together form an arithmetic sequencer. The system level interconnect is programmably configurable to connect different selectable programmable logic device sections in the digital blocks to other different selectable functional elements and to different selectable I/O pins. The system level interconnect is also programmably configurable to connect different selectable datapath sections in the same digital blocks to other different selectable functional elements and to different selectable I/O pins.

A selected I/O pin can operate as an input pin by coupling the selected I/O pin to an input for one of the functional elements while the integrated circuit is in a first operational state. The same I/O pin can also operate as an output pin by coupling the same selected I/O pin to an output for one of the functional elements while the integrated circuit is in a second operational state. Analog or digital signals from different I/O pins can also be synchronously multiplexed to a same functional clement through dynamic programming of the I/O pin connections.

This programmable switching consists of channel switches that programmably couple the horizontal channels of the system level interconnect to connect to the different functional elements in the system according to the configuration values. Segmentation switches in the system level interconnect programmably couple the horizontal channels to each other and vertical channels in the system level interrconnect according to the configuration values.

Different sets of interface signals are coupled to different associated functional elements and different associated I/O pins. The interface signals overlap with the different channel lines and programmably couple to the different channel lines according to the configuration values. The interface signals can be shorted together and each of the multiple shorted interface lines can be programmably coupled to multiple different channel lines according to the configuration values. Hold cells are connected to the interface lines and retain a last state prior to the integrated circuit being reconfigured. The hold cells can also set the associated interface lines to weak predetermined states upon receiving a reset signal.

INTRODUCTION

A system level interconnect allows signals to be routed globally on and off the chip and also increases the number of functions that can be supported while improving the overall routing efficiency in a digital programmable system. The system level interconnect is a general purpose routing resource interconnecting I/O pins with on-chip peripherals. The system level interconnect has two components: the interconnect matrix in the Universal Digital Block (UDB) array that connects different UDBs together and a Digital System Interconnect (DSI) that connects the UDB array to other peripherals and I/O pins. The system level interconnect enables on-chip peripherals to be connected to arbitrary input/output pins and then reconfigured on the fly in real time.

DETAILED DESCRIPTION

Figure 1:
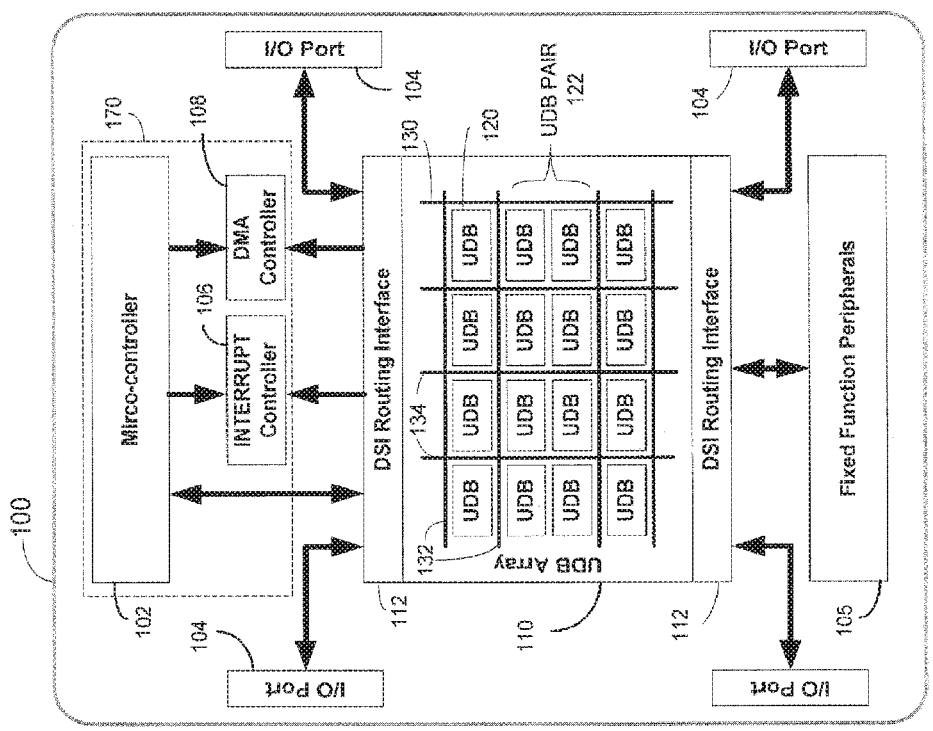
FIG. 1 is a schematic block diagram illustrating an example PSoC architecture that includes a Universal Digital Block (UDB) array.

FIG. 1 is a high level view of a Universal Digital Block (UDB) array 110 contained within a Programmable System on a Chip (PSoC) Integrated Circuit (IC) 100. The UDB array 110 includes a programmable interconnect matrix 130 that connects together the different UDBs 120. The individual UDBs 120 each include a collection of uncommitted logic in the form of Programmable Logic Devices (PLDs) and structural dedicated logic elements that form a datapath 210 shown in more detail in FIGS. 8 and 9.

UDB Array

The UDB array 110 is arranged into UDB pairs 122 that each include two UDBs 120 that can be tightly coupled to a shared horizontal routing channel 132. The UDB pairs 122 can also be programmably connected to the horizontal routing channels 132 of other UDB pairs 122 either in the same horizontal row or in different rows through vertical routing channels 134. The horizontal and vertical routing channels and other switching elements are all collectively referred to as the interconnect matrix 130.

A Digital System Interconnect (DSI) routing interface 112 connects a micro-controller system 170 and other fixed function peripherals 105 to the UDB array 110. The micro-controller system 170 includes a micro-controller 102, an interrupt controller 106, and a Direct Memory Access (DMA) controller 108. The other peripherals 105 can be any digital or analog functional element in PSoC 100. The DSI 112 is an extension of the interconnect matrix 130 at the top and bottom of the UDB array 110.

Figure 2:
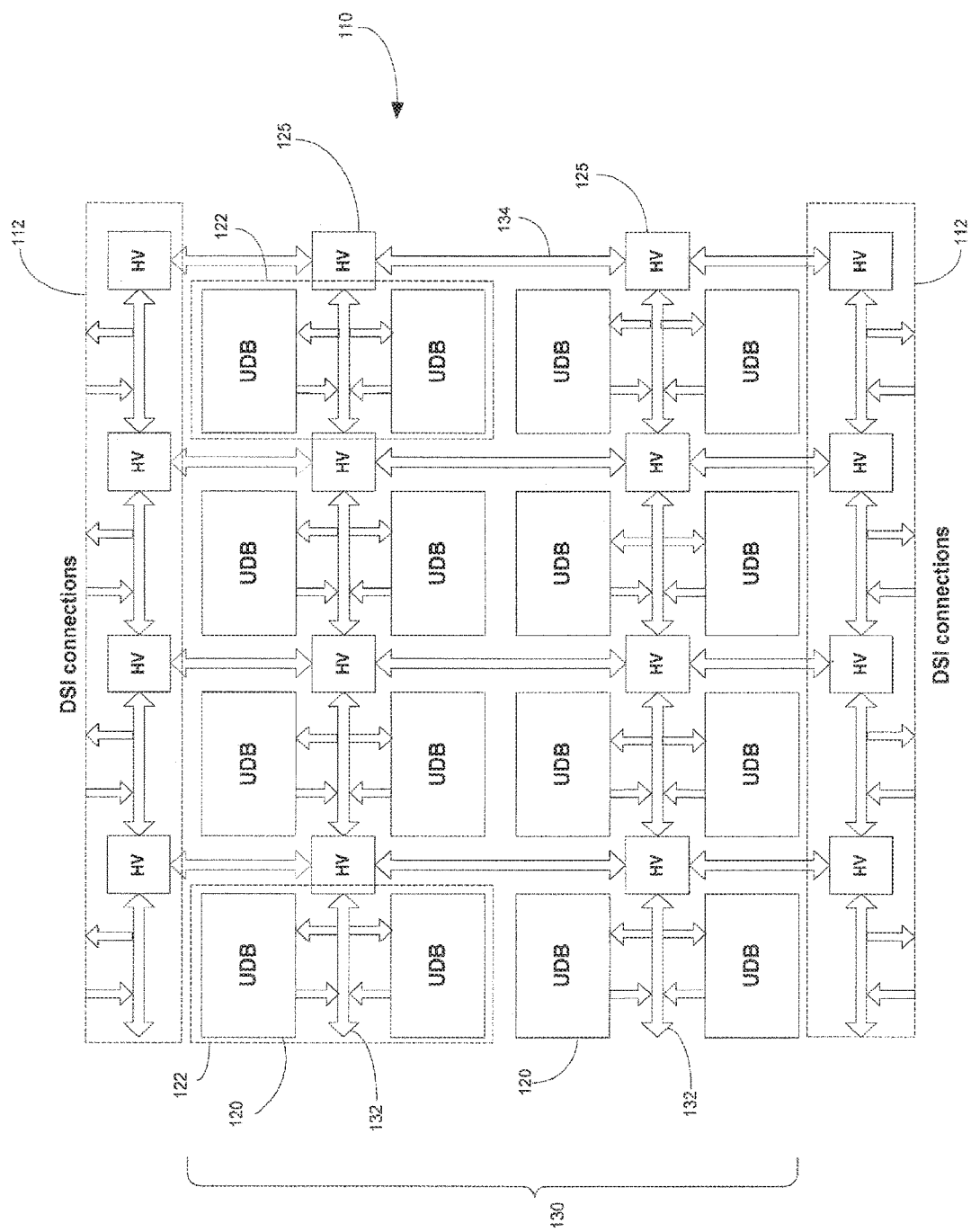
FIG. 2 is a schematic block showing an interconnect matrix in the UDB array.

FIG. 2 shows the interconnect matrix 130 in more detail and includes horizontal routing channels 132 that programmably connect with one or more associated Universal Digital Blocks (UDB) 120. In this example, pairs 122 of UDBs 120 are tightly coupled together through their associated horizontal routing channel 132. However, more than two UDBs 120 can be tightly coupled together through the same horizontal routing channel 132.

The interconnect matrix 130 also includes Horizontal/Vertical (H/V) segmentation elements 125 that programmably interconnect the different horizontal routing channels 132 together. The segmentation elements 125 couple together the horizontal routing channels 132 for the different digital block pairs 122 in the same rows. The segmentation elements 125 also programmably couple together the horizontal routing channels 132 for digital block pairs 122 in different rows through vertical routing channels 134.

Figure 3:
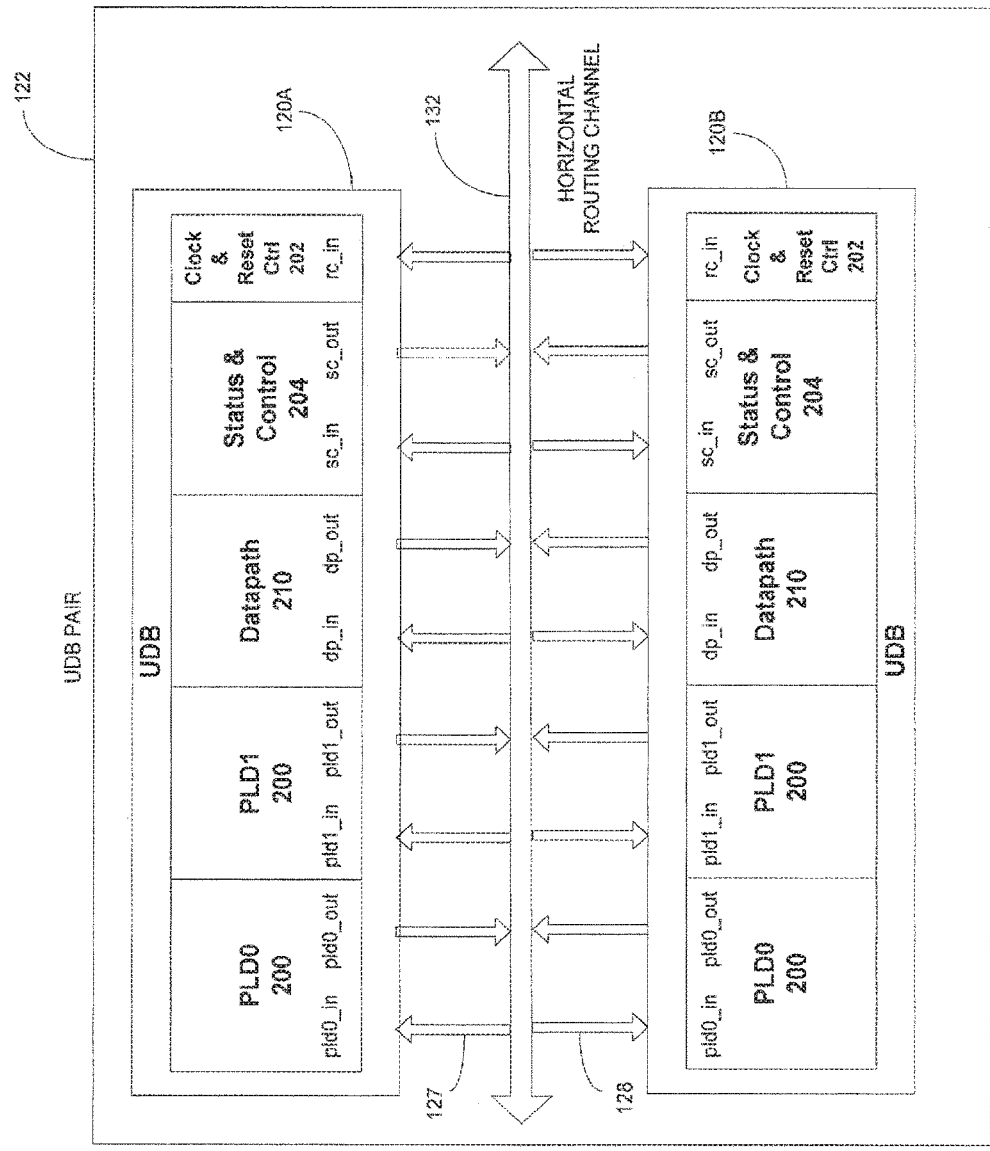
FIG. 3 is a schematic block diagram showing how a pair of UDBs are tightly coupled to a horizontal routing channel.

FIG. 3 shows one of the UDB pairs 122 in more detail. The UDBs 120A and 120B each contain several different functional blocks that in one embodiment include two Programmable Logic Devices (PLDs) 200, a data path 210, status and control 204, and clock and reset control 202. The operations of these different functional elements are described in more detail below in FIGS. 8 and 9.

The two UDBs 120A. and 120B in UDB pair 122 are tightly coupled together to common routes in the same associated horizontal routing channel 132. Tight coupling refers to the UDB I/O signals 127 in the upper UDB 120A and the corresponding signals 128 in the lower UDB 120B all being directly connected to the same associated horizontal routing channel 132. This tight coupling provides high performance signaling between the two UDBs 120A and 120B. For example, relatively short connections 127 and 128 can be programmably established between the upper UDB 120A and the lower UDB 120B.

In one embodiment, the horizontal routing channels 132 can also have a larger number of routes and connections to the UDBs 120A and 120B than the vertical routing channels 134 shown in FIG. 2. This allows the horizontal routing channels 132 to provide more interconnectivity both between the UDBs 120A and 120B in UDB pair 122 and also provides more interconnectivity between different UDB pairs 122 in the same rows of interconnect matrix 130.

Thus, the interconnect matrix 130 in FIGS. 1 and 2 more effectively uses chip space by providing more traces and connectivity for the shorter/higher performance horizontal routing channels 132 than the relatively longer/lower performance vertical routing channels 134.

Figure 4:
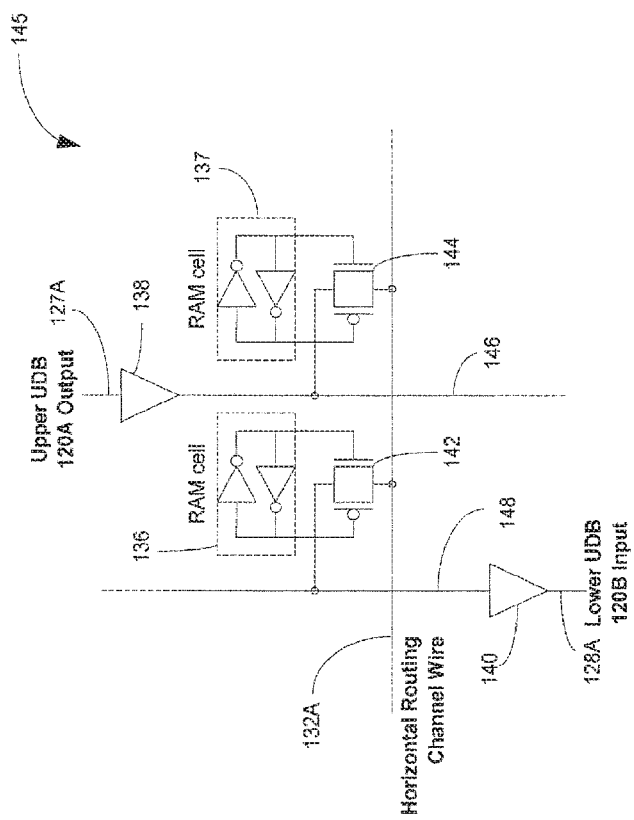
FIG. 4 is a schematic block diagram showing programmable switches that connect the UDBs in FIG. 3 to the horizontal routing channel.

FIG. 4 shows switching elements 145 that connect the different I/O signals 127 and 128 for the UDBs 120A and 120B in FIG. 3 to the horizontal routing channel 132. In this example, an output 127A from the upper UDB 120A in the UDB pair 122 drives an input 128A in the lower UDB 120B. A buffer 138 is connected to the UDB output 127A and a buffer 140 is connected to the UDB input 128A. The output 127A and input 128A are connected to vertical wires 146 and 148, respectively that intersect the horizontal routing channel wire 132A with a regular pattern.

At the switch points, RAM bits operate RAM cells 136 and 138 which in turn control Complem ntary Metal Oxide Semi-conductor (CMOS) transmission gate switches 142 and 144, respectively. The switches 142 and 144 when activated connect the UDB output 127A and the UDB input 128A to horizontal routing channel wire 132A.

Figure 7:
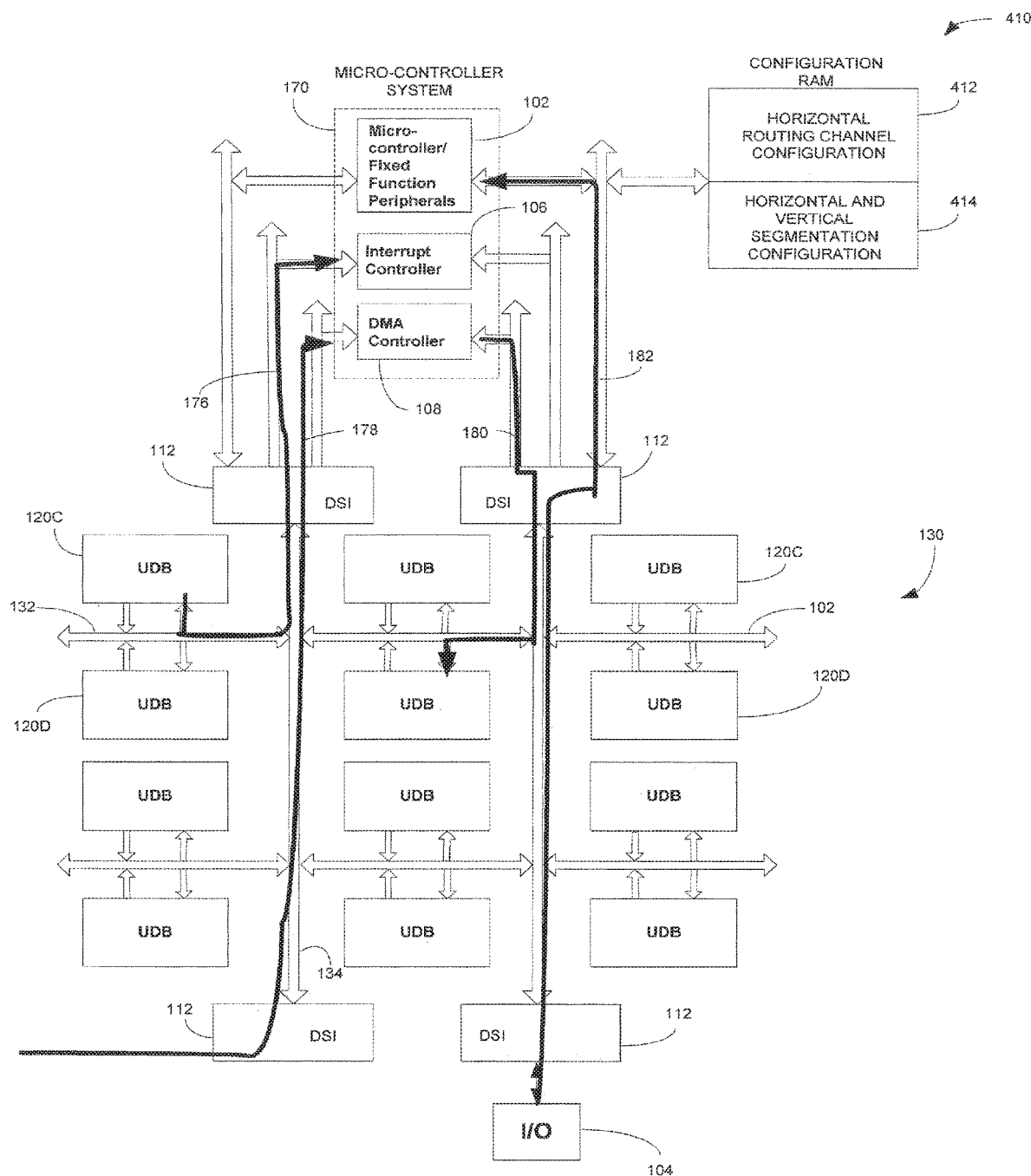
FIG. 7 is a schematic block diagram that shows how the interconnect matrix of FIG. 2 can connect different interconnect paths to a micro-controller system.

The RAM cells 136 and 137 are programmably selectable by the microcontroller 102 (FIG. 1) by writing values into a configuration RAM 410 (FIG. 7). This allows the microcontroller 102 to selectively activate or deactivate any of the gate switches 142 and 144 and connect any I/O 127 or 128 from either of the two universal digital blocks 120A and 120B to different wires in the horizontal channel 132.

Figure 5:
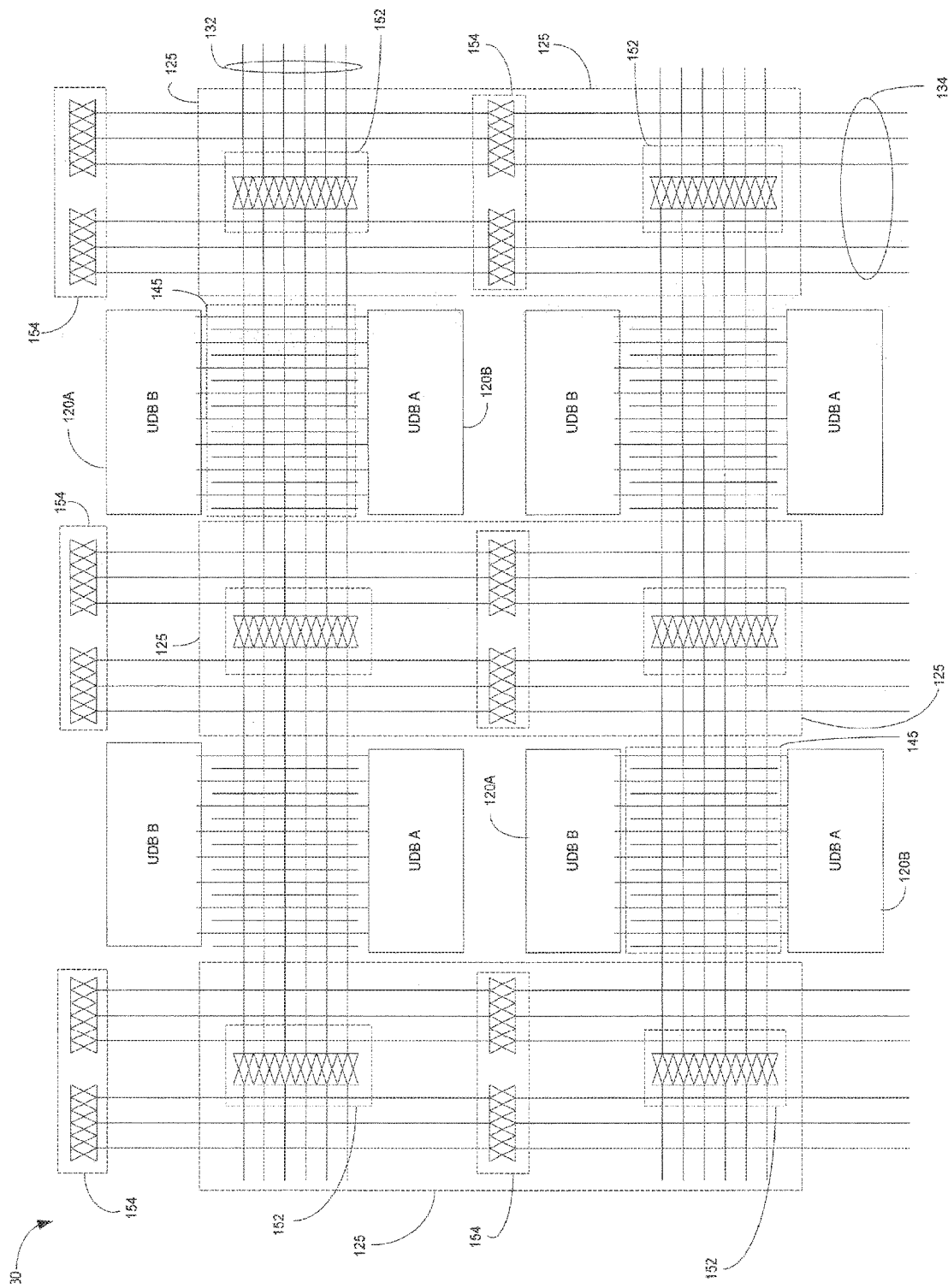
FIG. 5 is a schematic block diagram showing segmentation elements in the interconnect matrix.

FIG. 5 shows the interconnect matrix 130 previously shown in FIGS. 1 and 2 in further detail. The segmentation elements 125 can include different combinations of horizontal segmentation switches 152 and vertical segmentation switches 154. The horizontal segmentation switches 152 programmably couple together adjacent horizontal routing channels 132 located in the same row. The vertical segmentation switches 152 programmably couple together horizontal routing channels 132 located vertically in adjacent rows via vertical routing channels 134.

In addition to the segmentation elements 125, the interconnect matrix 130 includes the switching elements 145 previously shown in FIG. 4 that programmably connect the upper and lower UDBs 120A and 120B with their associated horizontal routing channels 132.

Figure 6:
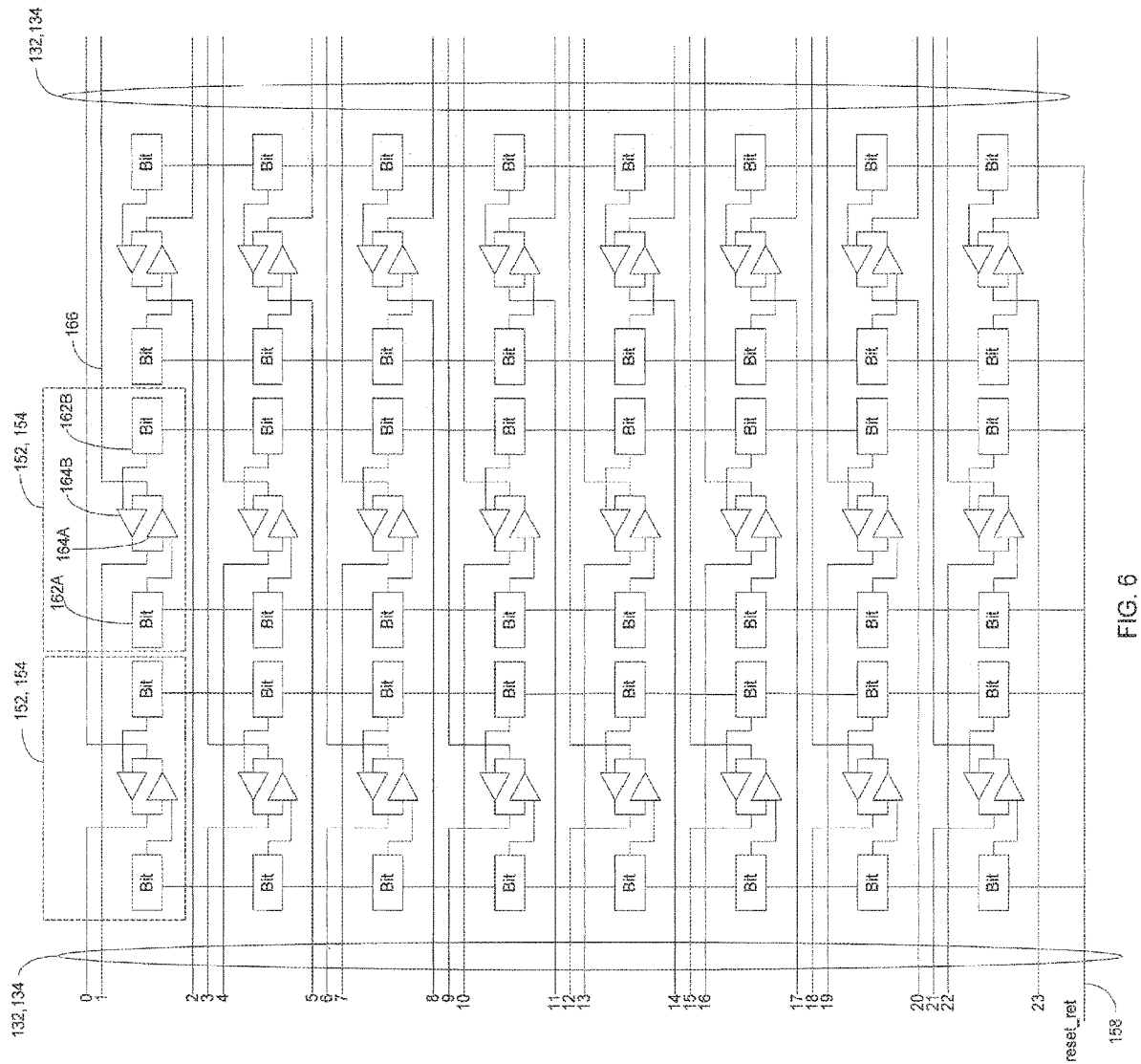
FIG. 6 is a schematic block diagram showing different programmable switches in the segmentation elements of FIG. 5 in more detail.

Referring to FIGS. 5 and 6, the segmentation elements 125 comprise arrays of horizontal segmentation switches 152 that are coupled in-between different horizontal routing channels 132 and vertical segmentation switches 154 coupled in-between the vertical routing channels 134. Each segmentation switch 152 and 154 is controlled by two bits 162A and 162B from the configuration RAM 410 (FIG. 7). The two bits 162A and 162B together control a tri-state buffer 164.

When bit 162A is set, the buffer 164A drives one of the horizontal or vertical channel lines 166 from left to right. When bit 162B is set, the buffer 164B drives the same horizontal or vertical channel line 166 from right to left. If neither bit 162A nor bit 162B is set, the buffers 164A and 164B drive line 166 to a high impedance state.

Configuration and Programmability

Any combination of the switching elements 145, horizontal segmentation switches 152, and vertical segmentation switches 154 can be programmably configured to connect together almost any combination of external I/O pins 104 (FIG. 1), UDBs 120, and micro-controller system elements 170 and fixed peripherals 105 (FIG. 1).

FIG. 7 shows different examples of how different types of interconnect paths can be programmed through the interconnect matrix 130. A Random Access Memory (RAM) or a set of configuration registers 410 are directly readable and writeable by the micro-controller 102. A first set of bits in RAM section 412 are associated with the RAM cells 136 and 137 shown in FIG. 4 that control connections between the inputs and output of UDB and their associated horizontal routing channels 132. A second set of bits in RANI section 414 control how the horizontal segmentation switches 152 in FIGS. 5 and 6 connect the horizontal routing channels 132 in the same rows together and other bits in RAM section 414 control how the vertical segmentation switches 154 connect together the horizontal routing channels 132 in different rows.

Pursuant to the micro-controller 102 programming RAM 410, the interconnect matrix 130 is configured with a first interconnect path 176 that connects a UDB 120C to the interrupt controller 106. The UDB 120C can then send interrupt requests to the DMA controller 108 over interconnect path 176. A second interconnect path 178 is established between a peripheral (not shown) in the PSoC chip 100 (FIG. 1) and the DMA controller 108. The peripheral sends DMA requests to the DMA controller 108 over the interconnect path 178 that includes system level interconnect 172 and interconnect matrix 130.

A third interconnect path 180 is also configured by the micro-controller 102 by loading bits into RAM sections 412 and 414. The DMA controller 108 uses the interconnect path 180 to send a DMA terminate signal to UDB 120D. A fourth interconnect path 182 is programmably configured between one of the PSoC I/O pins 104 and a fixed digital peripheral, such as the micro-controller 102. The interconnect path 182 is used to send I/O signals between the micro-controller 102 and the I/O pin 104.

Interconnect paths 176-182 are of course just a few examples of the many different interconnect configurations that can be simultaneously provided by the interconnect matrix 130. This example also shows how different I/O pins 104, UDBs 120, and other peripherals can be connected to the same interrupt line on the interrupt controller 106 or connected to the same DMA line on the DMA controller 108.

Typically, interrupt requests received by an interrupt controller and DMA requests received by a DMA controller can only be connected to one dedicated pin. The interconnect matrix 130 allows any variety of different selectable functional elements or I/O pins to be connected to the same input or output for the interrupt controller 106 or DMA controller 108 according to the programming of RAM 410 by micro-controller 102.

The programmability of the interconnect matrix 130 also allows any number, or all, of the I/O pins 104 to be undedicated and completely programmable to connect to any functional element in PSoC 100. For example, the pin 104 can operate as an input pin for any selectable functional element in FIG. 7. In another interconnect matrix configuration, the same pin 104 can operate as an output pin when connected to a first peripheral and operate as an output pin when connected to a different peripheral.

Universal Digital Block

Figure 8:
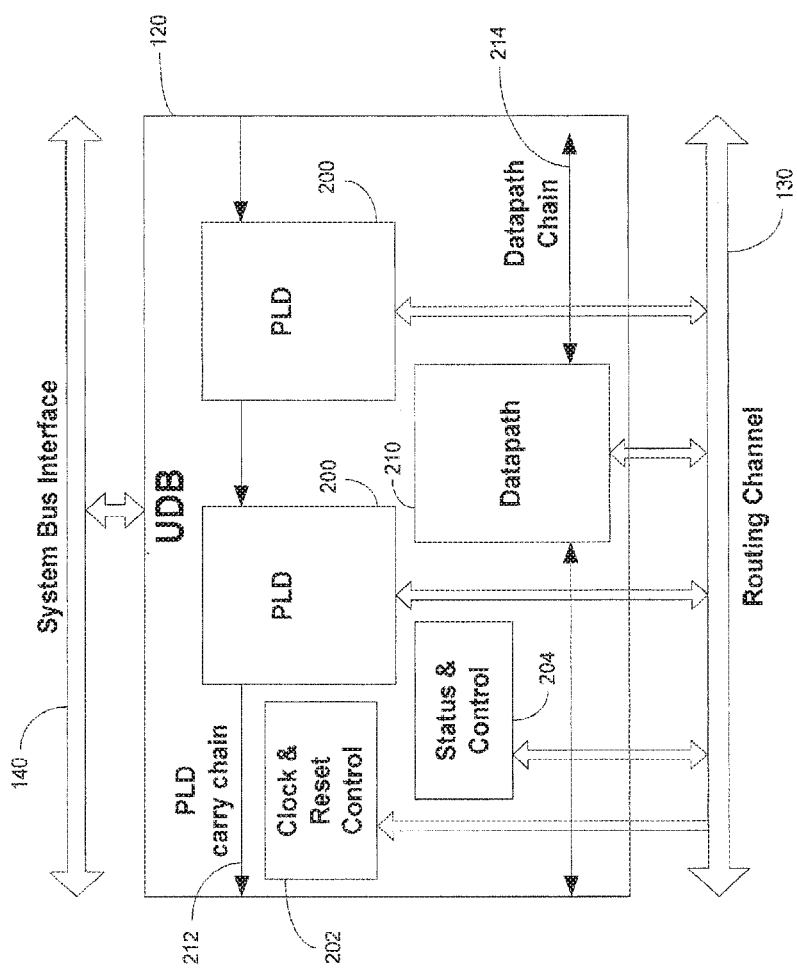
FIG. 8 is a schematic diagram that shows one of the UDBs in more detail.

FIG. 8 is a top-level block diagram for one of the UDBs 120. The major blocks include a pair of Programmable Logic Devices (PLDs) 200. The PLDs 200 take inputs from the routing channel 130 and foul registered or combinational sumof-products logic to implement state machines, control for datapath operations, conditioning inputs and driving outputs.

The PLD blocks 200 implement state machines, perform input or output data conditioning, and create look-up tables. The PLDs 200 can also be configured to perform arithmetic functions, sequence datapath 210, and generate status. PLDs are generally known to those skilled in the art and are therefore not described in further detail.

The datapath block 210 contains highly structured dedicated logic that implements a dynamically programmable ALU, comparators, and condition generation. A status and control block 204 allows micro-controller firmware to interact and synchronize with the UDB 120 by writing to control inputs and reading status outputs.

A clock and reset control block 202 provides global clock selection, enabling, and reset selection. The clock and reset block 202 selects a clock for each of the PLD blocks 200, the datapath block 210, and status and control block 204 from available global system clocks or a bus clock. The clock and reset block 202 also supplies dynamic and firmware resets to the UDBs 120.

Routing channel 130 connects to UDB I/O through a programmable switch matrix and provides connections between the different elements of the UDBs in FIG. 7. A system bus interface 140 maps all registers and RAMs in the UDBs 120 into a system address space and are accessible by the micro-controller 102.

The PLDs 200 and the datapath 210 have chaining signals 212 and 214, respectively that enable neighboring UDBs 120 to be linked to create higher precision functions. The PLD carry chain signals 212 are routed from the previous adjacent UDB 120 in the chain, and routed through each macrocell in both of the PLDs 200. The carry out is then routed to the next UDB 120 in the chain. A similar connectivity is provided for the set of conditional signals generated by the datapath chain 214 between datapath blocks 210 in adjacent UDBs 120.

Figure 9:
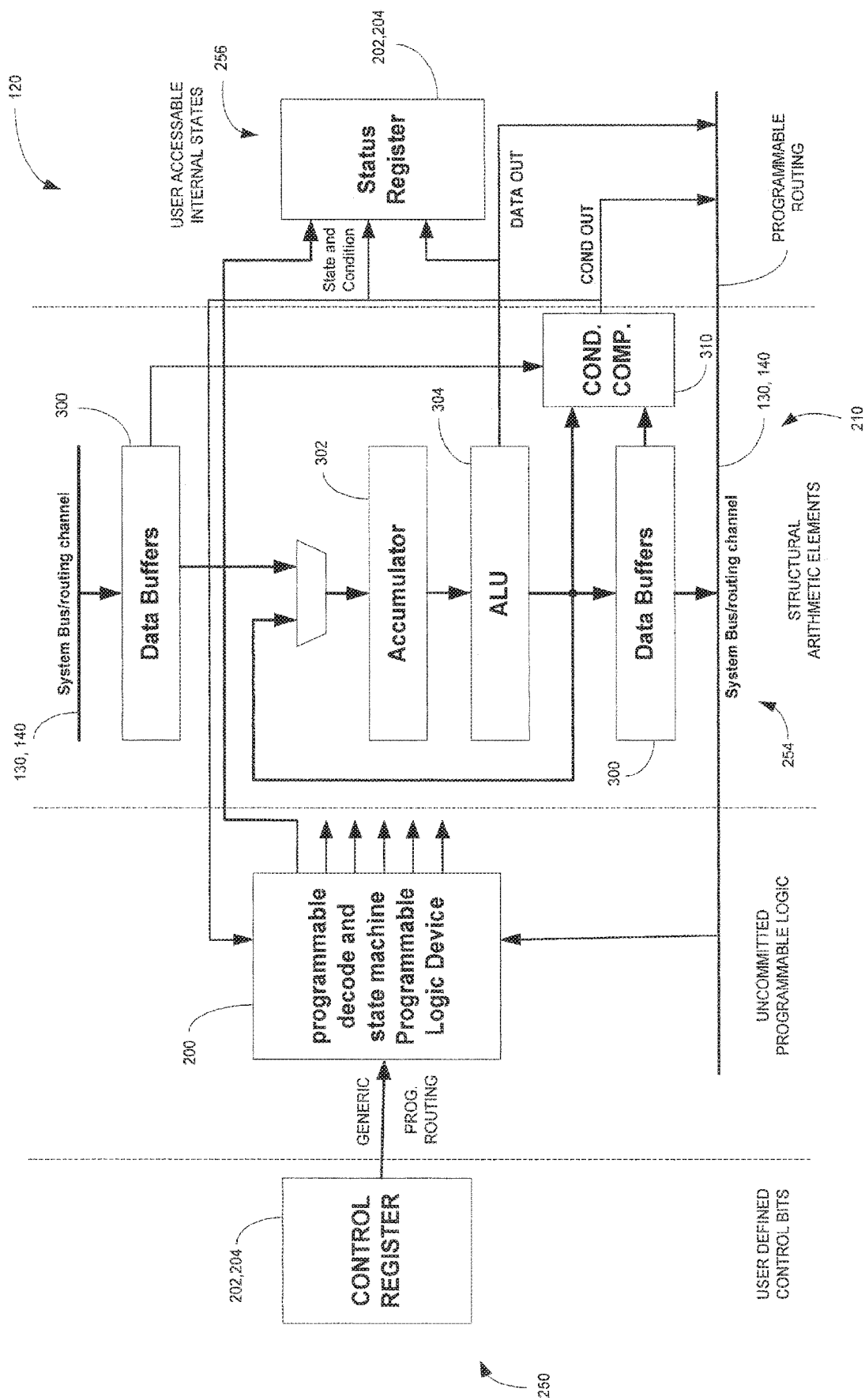
FIG. 9 is a schematic diagram that shows a datapath in the UDB of FIG. 8 in more detail.

Referring to FIG. 9, each UDB 120 comprises a combination of user defined control bits that are loaded by the micro-controller 102 into control register 250. The control register 250 is part of the control blocks 202 and 204 described above in FIG. 8. The control register 250 feeds uncommitted programmable logic 200 and control for structure datapath inputs. The same control blocks 202 and 204 described above in FIG. 8 also include associated status registers 256 that allow the micro-controller 102 to selectably read different internal states both the uncommitted logic elements and for structural arithmetic elements 254 within the datapath 210.

The datapath 210 comprises highly structured logic elements 254 that include a dynamically programmable ALU 304, conditional comparators 310, accumulators 302, and data buffers 300. The ALU 304 is configured to perform instructions on accumulators 302, and to perform arithmetic sequences as controlled by a sequence memory. The conditional comparators 310 can operate in parallel with the ALU 304. The datapath 210 is further optimized to implement typical embedded functions, such as timers, counters, pseudo random sequence generators, Cyclic Redundancy Checkers (CRC), Pulse Width Modulators (PWM), etc.

The combination of uncommitted PLDs 200 with a dedicated datapath module 210 allow the UDBs 120 to provide embedded digital functions with more silicon efficient processing. The dedicated committed structural arithmetic elements 254 more efficiently implement arithmetic sequencer operations, as well as other datapath functions. Since the datapath 210 is structural, fewer gates are needed to implement these structural elements 254 and fewer interconnections are needed to connect the structural elements 254 together into an arithmetic sequencer. Implementing the same datapath 210 with PLDs could require a much greater quantity of additional combinational logic and additional interconnections.

The structured logic in the datapath 210 is also highly programmable to provide a wide variety of different dynamically selectable arithmetic functions. Thus, the datapath 210 not only conserves space on the integrated circuit 100 (FIG. 1) but also is highly configurable similar to PLDs. It has an additional advantage of being dynamically configurable and reconfigurable.

The functional configurability of the datapath 210 is provided through the control registers 250 and allow the micro-controller 102 to arbitrarily write into a system state and selectively control different arithmetic functions. The status registers 256 allow the micro-controller 102 to also identify different states associated with different configured arithmetic operations.

The flexible connectivity scheme provided by the routing channel 130 selectively interconnects the different functional element 250, 200, 254, and 256 together as well as programmably connecting these functional element to other UDBs, I/O connections, and peripherals. Thus, the combination of uncommitted logic 200, structural logic 254, and programmable routing channel 130 provide as much functionality and more efficiently uses integrated circuit space.

The interconnect matrix 130 also requires little or no dedicated UDB block routing. All data, state, control, signaling, etc, can be routed through the interconnect matrix 130 in the UDB array 110. The array routing is efficient because there is little or no difference between a local UDB net and a net that spans the UDB array. Horizontal and vertical segmentation allow the array to be partitioned for increased efficiency and random access to the RAM 410 allow high speed configuration or on the fly reconfiguability.

System Level Interconnect

Figure 10:
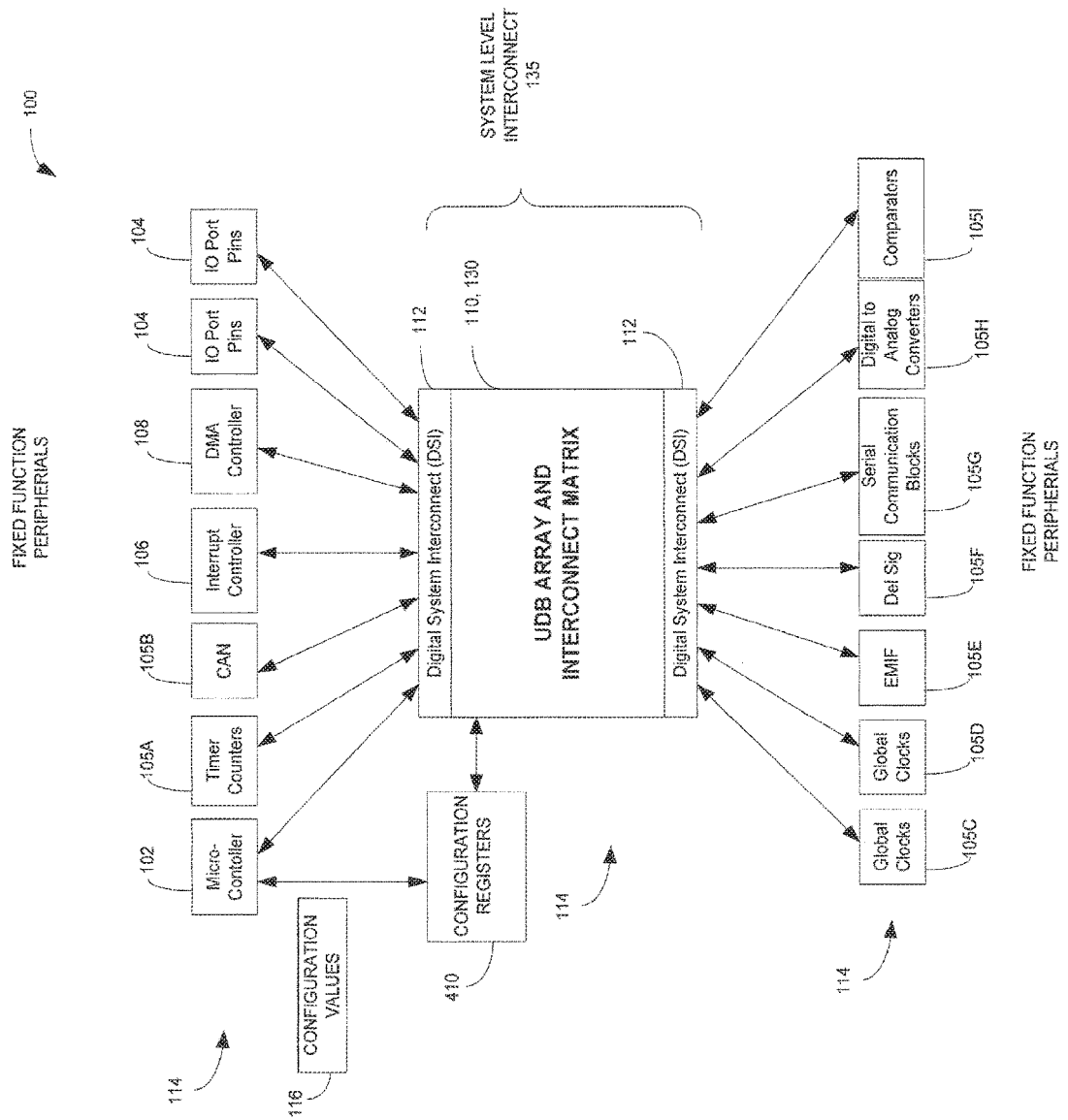
FIG. 10 is a diagram showing a system level interconnect.

FIG. 10 shows an abstract view of a system level routing architecture in the PSoC Integrated Circuit (IC) 100. The UDB array 110 includes DSI interfaces 1 12 at the top and bottom of the array 110. The DS' 112 is an extension of the interconnect matrix 130 described above in FIG. 2 and the combination of the DSI 112 and interconnect matrix 130 within UDB an-ay 110 is referred to generally as a system level interconnect 135.

The different peripherals 102, 105, 106, 108, and 110 are all referred to generally as functional elements 114 and can all be located in the same PSoC IC 100. Examples of fixed digital peripherals include, but are not limited to, timers and counters 105A, a Controller Area Network communications protocol (CAN) 105B, the micro-controller 102, the DMA controller 108, global clocks 105C and 105D, an External Memory Interface (EMIF) 105E, Delta Sigma ADC block (Del SIG) 105F, serial communication blocks 105G and comparators 105I. Fixed analog peripherals can include, but are not limited to Digital-to-Analog Converters (DACs) 105H. I/O pins 104 are alternatively referred to as I/O ports or I/O pins and provide the external signal path for the functional elements 114.

The micro-controller 102 configures the system level interconnect 135 by loading configuration values 116 into configuration registers or configuration memory 410. The system level interconnect 135 then programmably connects together the different functional elements 114 and different I/O pins 104 according to the configuration values 116 loaded into the configuration registers 410.

The system level interconnect 135 is configured by the micro-controller 102 to connect any of the different functional elements 114 to any of the different I/O pins 104 and can also be configured to connect any of the different functional elements 114 to each other according to the loaded configuration values 116. The system level interconnect 135 can also be dynamically reconfigured on-the-fly by the microcontroller 102 in real-time according to different operational states of the IC 100.

Figure 11:
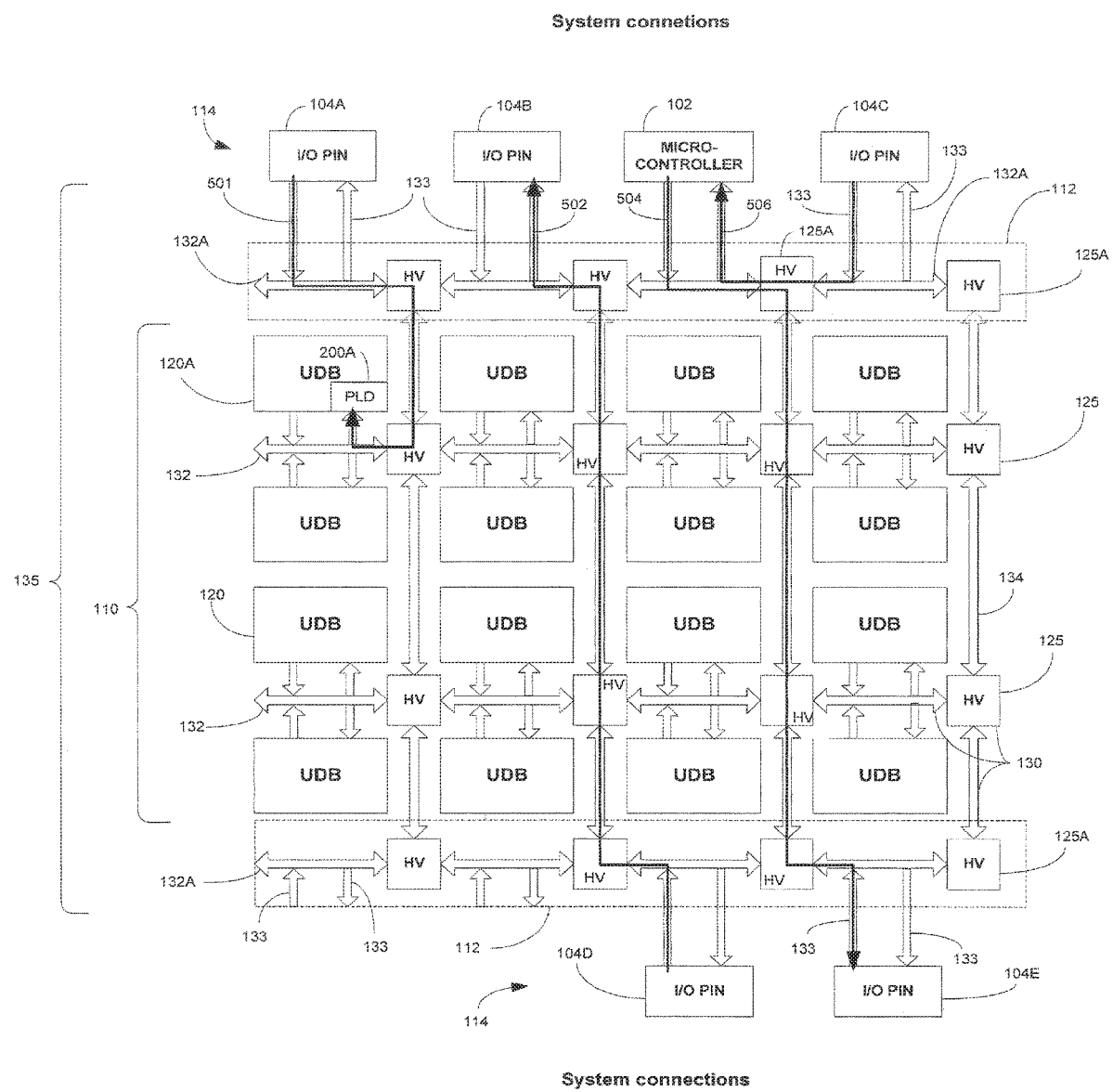
FIG. 11 is a more detailed drawing of the system level interconnect.

Referring to FIG. 11, the system level interconnect 135 includes both the interconnect matrix 130 used in the UDB array 110 and the DST 112. The DSI 112 provides the additional connectivity between the UDB array 110 and the other fixed functional elements 114 and I/O pins 104. The DSI 112 is built from similar functional blocks as the interconnect matrix 130. As with the interconnect matrix 130, the DSI 112 includes multiple horizontal channels 132A that are programmably connected together by segmentation elements 125A. The segmentation elements 125A also connect to other horizontal channels 132 in the UDB array 110.

The horizontal channels 132A in the DSI 112 are programmably connected to the different fixed peripherals 114 and different I/O pins 104 through interface lines 133. For example, FIG. 11 shows the micro-controller 102 and multiple different I/O pins 104A-104E connected to horizontal channels 132A via the interface lines 133. The different segmentation elements 125A in the DSI 112 then couple the horizontal channels 132A to each other and to other horizontal channels 132 in the UDB array 110.

System level routing provides multiple equivalent destinations. For example, routing from the I/O pin 104A to an input of a PLD 200A is facilitated by the fact that all PLD inputs are permutable, i.e., they are all equivalent. The concept of permutability at the destination is applied as a general rule for internal array destinations in the UDBs 120 (PLD inputs, datapath inputs, clock and reset inputs, etc). However, it is also applied to destinations outside the UDB array 110.

The system level interconnect 135 allows any I/O from any UDB 120 to be connected to any other UDB I/O in any other UDB array 110. Further, any I/O from any UDB 120 in UDB array 130 can also be connected to any I/O of any fixed peripheral element 114 or connect to any I/O pin 104. Further, any I/O for any peripheral 114 can also be connected to any I/O of another other peripheral 114 and can also be connected to any I/O pin 104.

FIG. 11 shows some examples. In a first example, the micro-controller 102 (FIG. 10) configures a first path 501 in the system level interconnect 135 that couples I/O pin 104A to one of the inputs of the PLD 200A in UDB 120A. At the same time, the micro-controller 102 configures a second path 502 in the system level interconnect 135 that connects the I/O pin 104B directly to the pin 104 D.

In this example, the micro-controller 102 also loads configuration values 116 into configuration registers 410 that configure a path 504 in the system level interconnect 135 that connect an output of micro-controller 102 to I/O pin 104E and also configure a path 506 that connects an input of micro-controller 102 to I/O pin 104C. Any combination of different connection paths can be created by loading associated configuration values 116 into the configuration registers 401 shown in FIG. 10.

Figure 12:
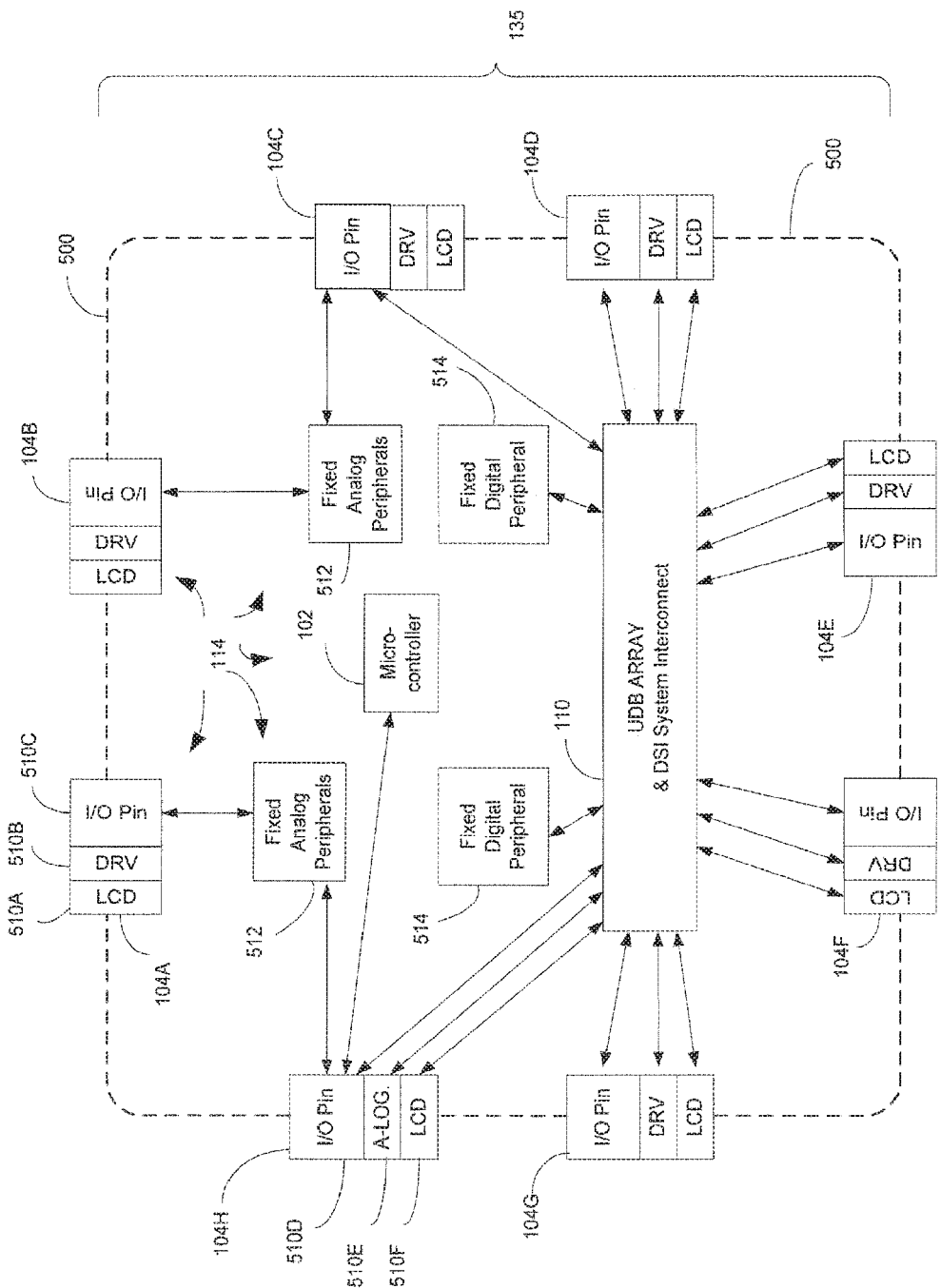
FIG. 12 is a diagram showing how I/O pins can be reconfigured using the system level interconnect.

FIG. 12 is another abstract view of the system level interconnect 135 shown extending around the edge of an integrated circuit 500. In this example, the same or a similar interconnect matrix 130 is used in the UDB array 110 and used in conjunction with the DSI 112. The embodiment in FIG. 12 may also have a separate control bus that extends around the periphery of IC 500 that selectively connects to the different functional elements 114. Prior to configuring the system level interconnect 135, the I/O pins 104 are effectively undedicated and unconnected to any functional element 114. After configuration, the I/O pins 104 provide any type of input and/or output associated with the connected functional element 114.

For example, some pins 104 are configured by the micro-controller 102 to operate as an I/O connection for a Liquid Crystal Display (LCD) function 510A, a multi-level driver (DRV) function 510B, and a general digital I/O function 510C. These different functions 510A-510C can be configured in the PLDs 200, datapaths 210, or fixed peripherals 512 and 514. The functions 510A-510C are shown next to pins to represent the pins 104 being associated with different functional elements in IC 500.

Depending on the operational state of the IC 500, the different configuration values 116 in configuration register 410 (FIG. 10) are changed by the micro-controller 102 to reconnect the pins to the different functions 510A-510C. For example, pin 104A may initially operate as an I/O pin for digital I/O function 510C. Upon detection of a particular signal or state, the micro-controller 102 may then reconfigure the system level interconnect 135 to connect pin 104A to the LCD function 510A.

In another example, the system level interconnect 135 is initially configured to connect pin 104H as a digital input for a digital function 510D in one of the UDBs 120 of UDB array 110. After a particular signal or state is detected in the IC 500, the micro-controller 102 reconfigures the system level interconnect 135 to connect pin 104H to a digital output of a digital function 510E in one of the fixed digital peripherals 514.

Figure 13:
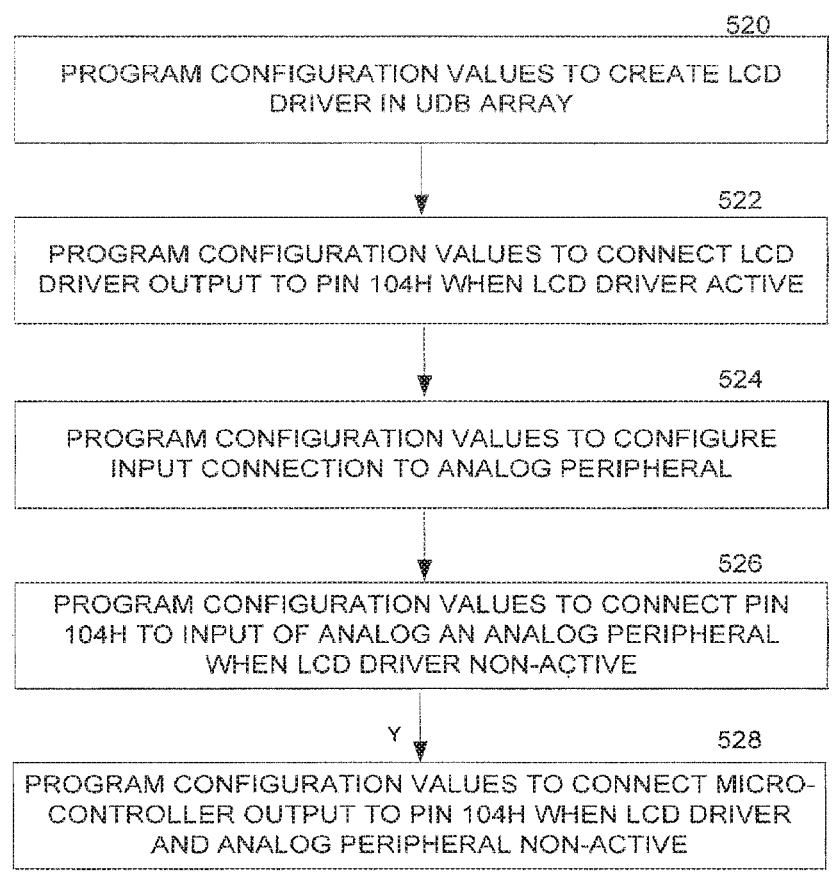
FIGS. 13 and 14 are flow diagrams explaining how I/O pins are dynamically reconfigured for different operations.

Referring to FIGS. 12 and 13, the pin 104H in another example is dynamically configured to operate as an external I/O for a digital function 510D, an analog function 510E, and a LCD function 510F. In operation 520, the micro-controller 102 loads configuration values 116 into configuration registers 410 that configure a LCD driver in the UDB array 110. Other configuration values 116 in the registers 410 are loaded into the configuration registers 410 in operation 522 that configure the system level interconnect 135 to connect pin 104H to the output of LCD driver 510F.

Operation 524 loads configuration values 116 into the registers 410 that configure an analog-to-digital converter in one of the fixed analog peripherals 512. Operation 526 may happen later during a different operating state and loads configuration values into the configuration registers 410 that connect pin 104H to the analog-to-digital converter when the LCD driver 510F is inactivated. Finally, operation 528 loads configuration values into registers 410 that ca-use the same pin 104H to connect to the micro-controller 102 when the LCD driver 510F and the analog-to-digital converter 510E are both inactive.

Figure 14:
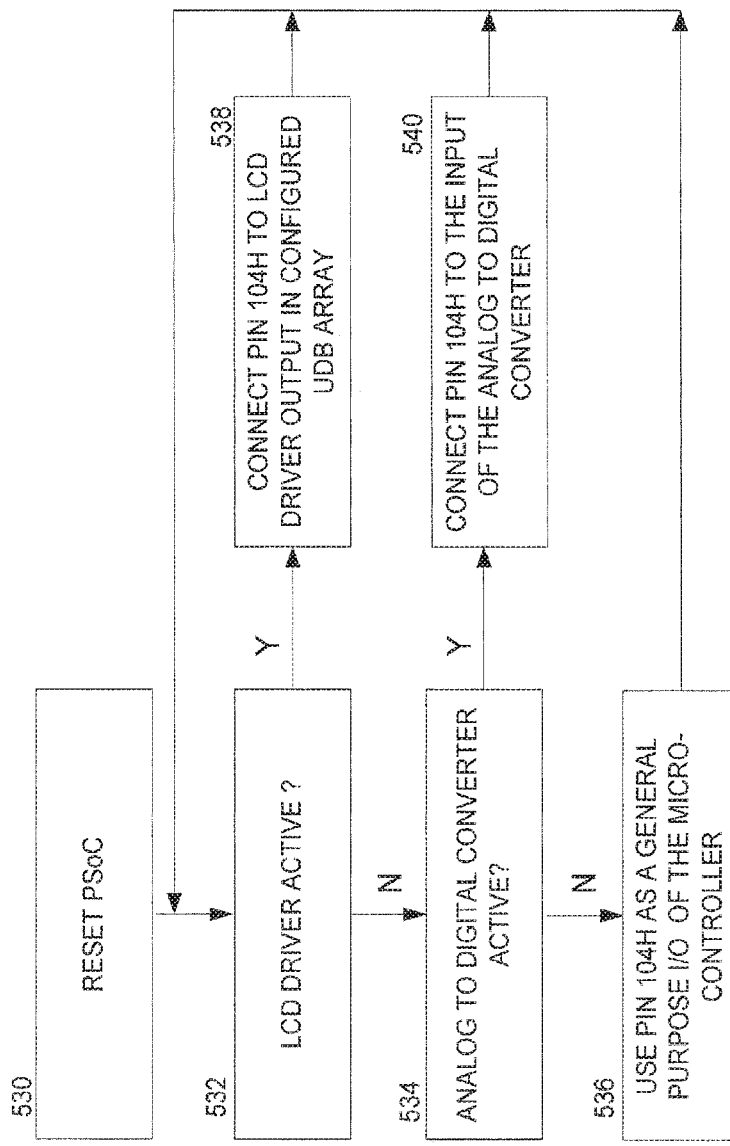

FIG. 14 further explains how the IC 500 in FIG. 12 operates according to the configuration values 116 loaded into the registers 410. In operation 530, the PSoC IC is reset. When the LCD driver 510H is active in operation 532, pin I 04I-1 is connected to the LCD driver output in operation 538. When the LCD driver is inactive but the analog-to-digital converter 510E is active in operation 534, pin 104H is connected to the analog-to-digital converter 510E in operation 540. Otherwise, pin 104H is connected through the system level interconnect 135 to the micro-controller 102 in operation 536. The micro-controller 102 then waits for the LDC driver 510F or the analog-to-digital converter 510E to reactivate and accordingly reconnects pin 104H to the activated function.

In yet another example, the system level interconnect 135 is configured to synchronously multiplex two different analog signals from different I/O pins 104B and 104C to the same fixed analog peripheral 512. The analog peripheral in one example is also an analog-to-digital converter. In this example, a clock in UDB array 110 synchronously causes the micro-controller 102 to reconfigure system level interconnect 135 to toggle connecting pins 104B and 104C to the fixed analog peripheral 512 on a clocked periodic basis. Thus, the system level interconnect 135 in this example operates essentially as an analog multiplexer switching between the analog signal on I/O pin 104B and the analog signal on I/O pin 104C.

Figure 15:
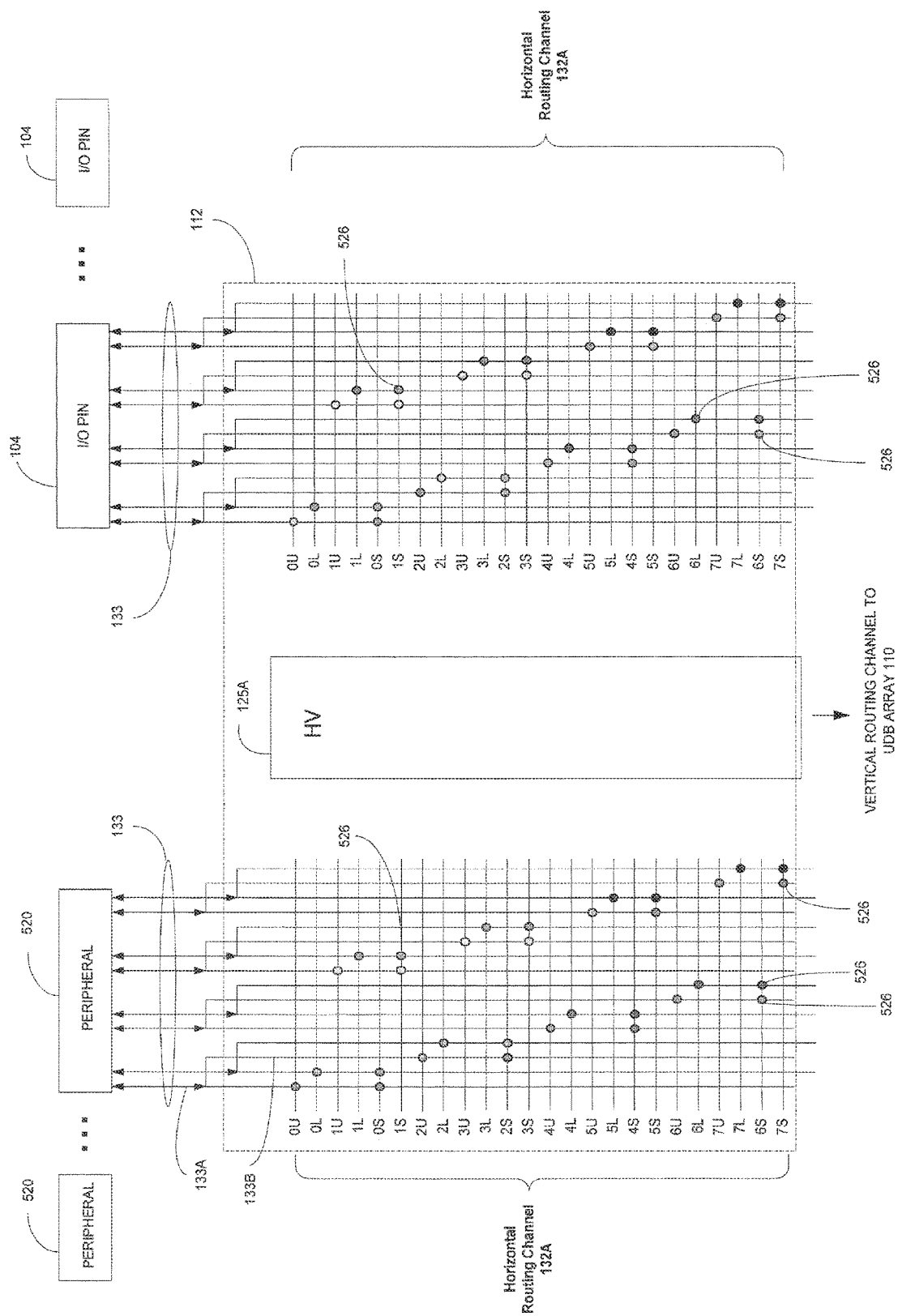
FIGS. 15 and 16 are more detailed diagrams of a Digital System Interconnect (DSI) used in the system level interconnect shown in FIG. 10.

FIG. 15 shows the DSI 112 from FIG. 11 in more detail. The segmentation elements 125A are essentially the same as those shown in FIGS. 5 and 6. The segmentation elements 125A connect adjacent horizontal channels 132A together and also connect the horizontal channels 132A to other horizontal channels in the UDB array 110.

Different sets of interface lines 133 are coupled to different associated peripherals 520 or I/O pins 104. The interface lines 133 overlap with multiple different channel lines in associated horizontal channels 132A and programmably couple to the different channel lines according to particular configuration values 116 (FIG. 10) that activate associated switching elements 526.

Multiple different interface lines 133 for the same peripheral 520 or for the same connector 104 are shorted together. For example, interface lines 133A and 133B in FIG. 15 are both shorted together. Shorting multiple interface lines together increases connectivity and allows shorter system level interconnect paths between the peripherals 520, I/O pins 104, and UDB array 110.

Figure 16:
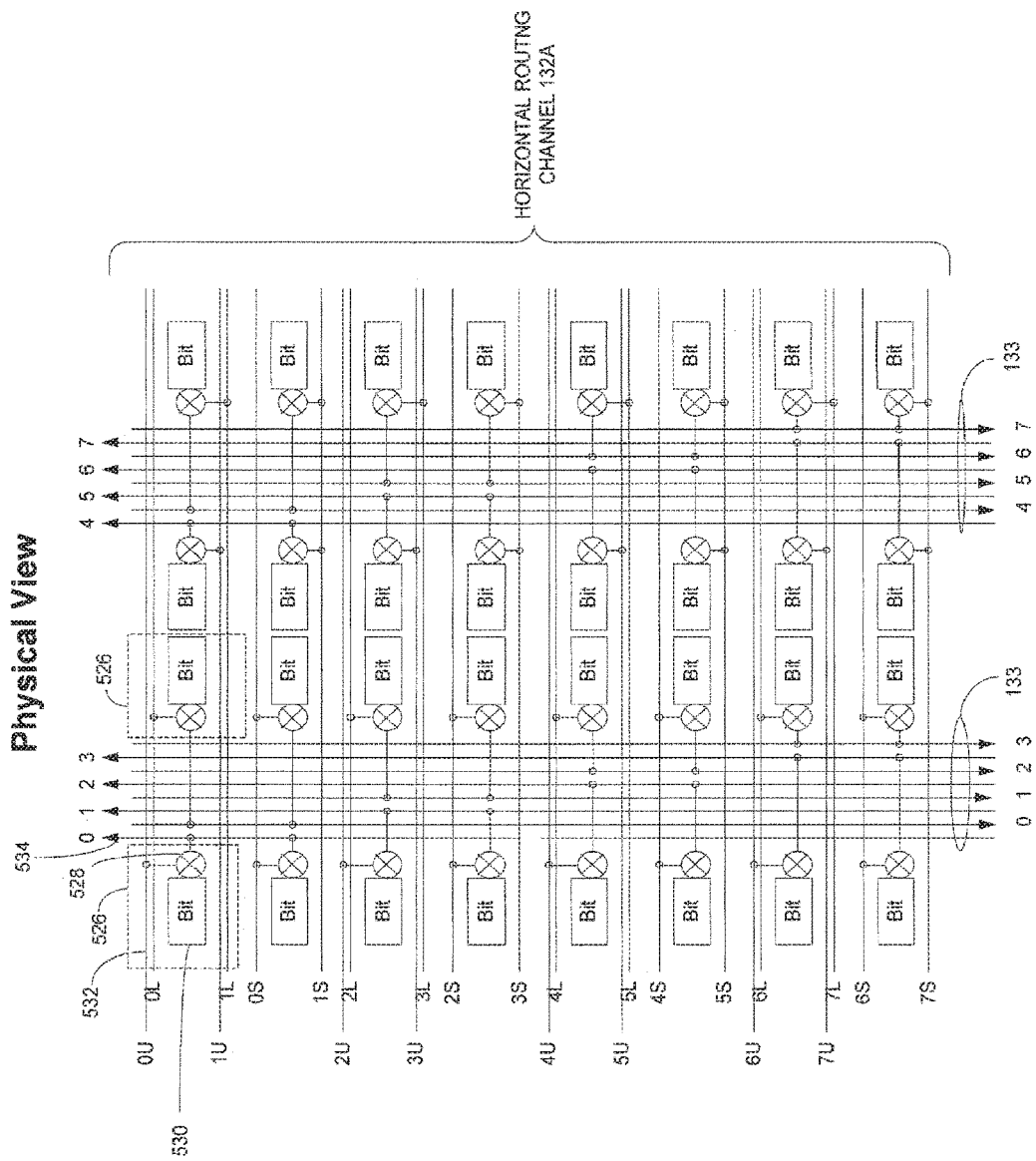

FIG. 16 shows the switching elements 526 in FIG. 15 in more detail. Each switching element 526 includes an associated bit 530 that is located in one of the configuration registers 410 shown in FIG. 10. The bits 530 control an associated gate 528 that when activated connect a horizontal channel line 532 to an interface line 534. As shown in FIG. 16, multiple interface switching elements 526 can be attached to the same interface line 534 and at ached to multiple different horizontal channel lines 532. This again increases the connectivity of the peripherals 520 and I/O pins 104 in FIG. 15 with horizontal routing channel 132A. The bits 530 can be loaded into the configuration registers 410 by the micro-controller 102 and can be dynamically changed by the micro-controller 102 during IC operation as described above.

Figure 17:
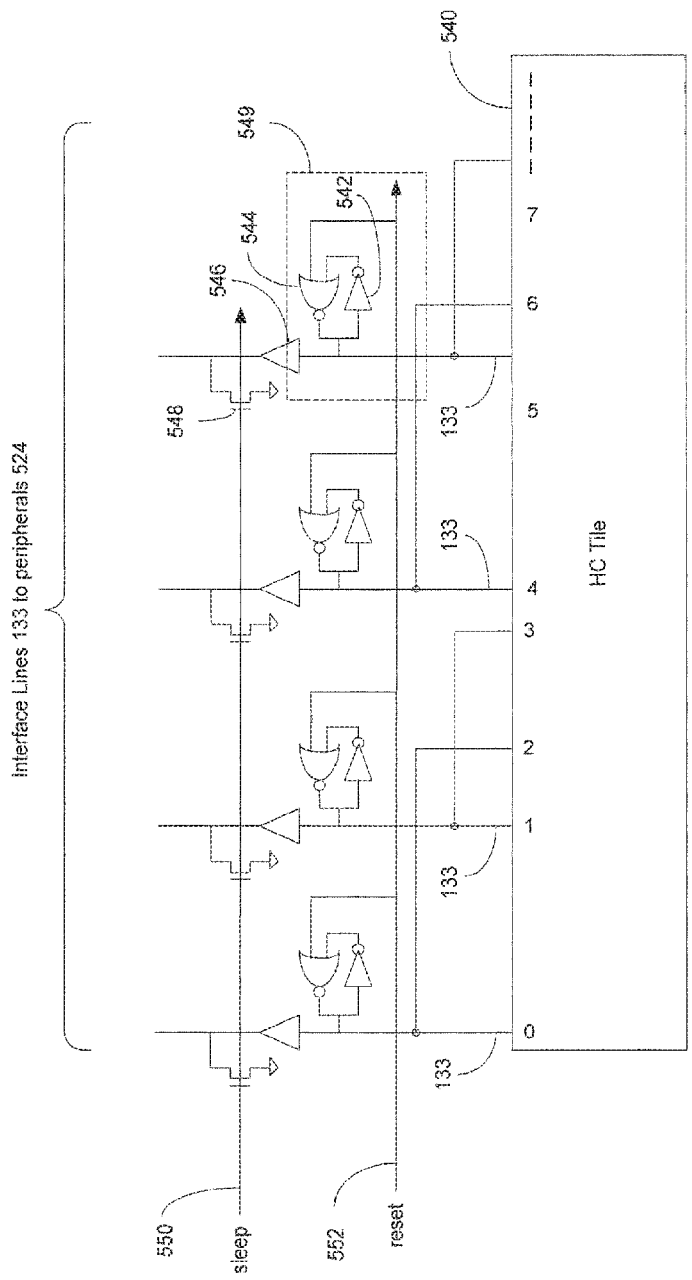
FIG. 17 shows how holds bits are used on interface lines.

FIG. 17 shows hold cells 549 that retain a last state on associated interface lines 133 prior to the integrated circuit being reconfigured and further set the interface lines 133 to weak predetermined states upon receiving a reset signal 552.

A tile 540 contains the interconnects previously shown in FIG. 16. Multiple different tiles 540 are arranged to connect the different peripherals 520 and I/O pins 104 (FIG. 15) to the horizontal routing channels 132A. The interface lines 133 at the top of each tile are coupled to hold cells 549 and gates 548. The gates 548 ground the interface lines 133 when a sleep signal 550 is asserted.

When a digital value is output on one of the interface lines 133 and the reset value is low, inverter 542 in hold cell 549 inverts the value which is then inverted back by the NOR gate 544. This holds the original digital state on the interface line 133.

Floating signals can cause problems for certain device inputs. For example, the floating state may be incorrectly interpreted as logic high or logic low values and in turn cause operational errors. To avoid this floating condition, the reset line 552 is asserted high causing all of the hold buffers 549 to output a weak zero value on the interface lines 133. A logic one or logic zero signal asserted on any one of the interface lines 133 overrides the weak zero signal and causes the hold cell 549 to latch the new signal state.

The system described above can use dedicated processor systems, micro controllers, programmable logic devices, or microprocessors that perform some or all of the operations. Some of the operations described above can be implemented in software and other operations can be implemented in hardware.

For the sake of convenience, the operations are described as various interconnected functional blocks or distinct software modules. This is not necessary, however, and there can be cases where these functional blocks or modules are equivalently aggregated into a single logic device, program or operation with unclear boundaries. In any event, the functional blocks and software modules or features of the flexible interface can be implemented by themselves, or in combination with other operations in either hardware or software.

Having described and illustrated the principles of the invention in a preferred embodiment thereof, it should be apparent that the invention can be modified in arrangement and detail without departing from such principles. Claim is made to all modifications and variation coming within the spirit and scope of the following claims.

What is claimed is:

1. A method for operating a system level interconnect in an integrated circuit (IC), the method comprising:
    writing, by a microcontroller in the IC, a first configuration value into a configuration register, wherein the first configuration value programs the system level interconnect to couple a first peripheral to a second peripheral;
    monitoring the IC to determine an operational state of the IC; and
    in response to determining a change in the operational state of the IC, writing by the microcontroller a second configuration value into the configuration register to dynamically change interconnections in the system level interconnect between the first peripheral and the second peripheral.

2. The method of claim 1, further comprising writing, by the microcontroller, a third configuration value into the configuration register, wherein the third configuration value controls how programmable logic devices in the IC operate.

3. The method of claim 2, further comprising writing, by the microcontroller, a fourth configuration value into the configuration register, wherein the fourth configuration value controls how structural arithmetic sequence elements in the IC operate.

4. The method of claim 3, further comprising writing, by the microcontroller, a fifth configuration value into the configuration register, wherein the fifth configuration value controls how an interconnect matrix couples together the programmable logic devices, the structural arithmetic sequencer elements, and one or more connectors.

5. The method of claim 1, wherein at least one of the first peripheral and the second peripheral comprises a programmable logic block.

* * * * *